(12) United States Patent  
Spinar et al.

(10) Patent No.: US 8,643,396 B2  
(45) Date of Patent: Feb. 4, 2014

(54) PROBING TIP FOR A SIGNAL ACQUISITION PROBE

(75) Inventors: James E. Spinar, Clackamas, OR (US); Richard R. Lynn, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 428 days.

(21) Appl. No.: 13/149,332

(22) Filed: May 31, 2011

(65) Prior Publication Data

US 2012/0306522 A1    Dec. 6, 2012

(51) Int. Cl.
*G01R 31/00* (2006.01)

(52) U.S. Cl.
USPC ............. 324/755.01; 324/754.03; 324/755.09

(58) Field of Classification Search
None
See application file for complete search history.

(56) References Cited

U.S. PATENT DOCUMENTS

| | | | |
|---|---|---|---|
| 4,983,910 A | * | 1/1991 | Majidi-Ahy et al. .... 324/754.06 |
| 5,274,336 A | * | 12/1993 | Crook et al. .................. 324/690 |
| 5,512,838 A | | 4/1996 | Roach |
| 6,091,256 A | * | 7/2000 | Long et al. ............... 324/754.12 |
| 6,518,780 B1 | | 2/2003 | Campbell et al. |
| 6,650,131 B2 | | 11/2003 | Campbell et al. |
| 6,704,670 B2 | | 3/2004 | McTigue |
| 6,809,535 B2 | | 10/2004 | Campbell |
| 7,056,134 B2 | | 6/2006 | Martin et al. |
| 7,140,105 B2 | | 11/2006 | Campbell |
| 7,202,678 B2 | | 4/2007 | Campbell et al. |
| 7,321,234 B2 | | 1/2008 | Campbell et al. |

* cited by examiner

*Primary Examiner* — Minh N Tang  
(74) *Attorney, Agent, or Firm* — William K. Bucher; Marger Johnson & McCollom, PC

(57) ABSTRACT

A probing tip for a signal acquisition probe has a non-conductive substrate compatible with thin or thick film processing having opposing horizontal surfaces and side surfaces with two of the side surfaces converging to a point. A contoured probing tip contact is formed at the converging point on the non-conductive substrate with the probing tip contact having first and second intersecting arcuate surface. Electrically conductive material is deposited on the countered probing tip contact using thin or thick film processing for providing electrical contact to test points on a device under test. A resistive element is formed on the non-conductive substrate using thin film processing that is electrically coupled to the probing tip contact and to an input of an amplifier formed on an integrated circuit die mounted on the non-conductive substrate. The output of the amplifier is coupled to a transmission structure formed on a second non-conductive substrate.

16 Claims, 3 Drawing Sheets

PROBING TIP FOR A SIGNAL ACQUISITION PROBE

BACKGROUND OF THE INVENTION

The present invention relates generally to signal acquisition probes for measurement instruments and more particularly to a probing tip formed on a non-conductive substrate.

A signal acquisition probe is used in conjunction with a measurement instrument, such as an oscilloscope, logic analyzer, spectrum analyzer and the like, for coupling an acquired test signal from a device under test (DUT) to the measurement instrument for analysis and display of the test signal. Signal acquisition probes have at least one electrically conductive probing tip formed of an electrically conductive material, such as copper, beryllium-copper, aluminum, steel, metal alloys, such as nickel-palladium alloy, and the like. The probing tips may be formed as conical nails or pins that taper to a point. Other tip configurations include bevels, wedges and the like.

The signal acquisition probe has probe head with an electrically conductive hollow tube having a substrate disposed therein. The substrate may be formed of ceramic or circuit board material and the like and has passive and/or active circuitry thereon to prevent loading of the test signal and for conditioning the signal for coupling to the measurement instrument. One end of the hollow tube has an insulating plug disposed therein with probing tip coaxially extending from the plug in both directions. The portion of the probing tip extending into the hollow body is electrically connected to the substrate. The probing tip may be electrically coupled to the substrate using spring loaded electrical contacts, electrically conductive fuzz buttons, wire bonding, soldering or the like. An electrically conductive cable is attached to the substrate for coupling the conditioned electrical signal to the measurement instrument. The overall bandwidth of measurement probes using metal probing tips is limited due to capacitive and inductive effects of the metal probing tips.

As the bandwidth of measurement increases, there is a corresponding need for measurement probes having equal or greater bandwidths. A major difficulty in designing very wide bandwidth measurement probes having bandwidths of 5 GHz and greater is the effects of capacitance and inductance of the probing tip or tips. One solution to this problem is to separate the probing tips from the active circuitry in the probing head of the measurement probe. U.S. Pat. No. 6,704,670 describes a wideband active probing system where the probing tip or tips of the probe are separable from a probe amplifier unit. A probe tip unit is connected to the probe amplifier unit via one or more probe cables for conveying signals received by a probe unit. Various types of probe tip units may be connected to the probe amplifier unit. The probe tip unit may contain circuitry ranging from conductor traces to various resistive, capacitive, and/or other electronic elements. An advantage of such a probe design is that it allows the placement of the substantially smaller probe tip unit onto difficult to reach contacts on a device under test instead of a larger measurement probe containing probe amplifier circuitry.

The probe tip unit may be single ended or differential and includes a hand-held differential browser having variable spacing. The hand-held browser allows a user to manually probe various points on the device under test. The probe tip unit may also have probe connection points for electrically connecting various types of probing tips to the probe tip unit. The probing tips are secured to the probe connection points of the probe tip unit by soldering or compression terminal connections. Various types of probing tips may be soldered to the probe connection points, such as resistors, SMT grabbers, wedge probe tips and the like.

U.S. Pat. No. 7,056,134 describes attachable/detachable probing tip system mountable on a probing tip member that is attached to a probe body via coaxial cables. The attachable/detachable probing tip system has a probe tip mounting member that receive various types of probing tips, such as wire leads extending from resistive elements and resistors with wire leads attached to electrically conductive traces disposed on flex-circuit material formed as probing arms. The probe tip mounting member has attachment arms that engage the probe tip member for securing and electrically connecting the probing tips to the probe tip member.

The above described probing tip systems allows the placement of damping resistors in close proximity to the probe contact point on the device under test using the wire leads of resistors. Placement of resistive elements close to the probe contact point on the DUT reduces the loading of the device under test at high frequencies and reduces the capacitive effects of the metallic resistor leads. Probe bandwidths as high as 20 GHz have been achieved using the above described probing systems.

There is a continuing need for signal acquisition probes with higher and higher bandwidths. This requires rethinking of how signal acquisition probes make electrical contact with test point on the device under test. Replacing the traditional metal probing tips, be it traditional metals tips or wire leads of resistors, is one alternative to increasing signal acquisition probe bandwidths into the 30 GHz range.

SUMMARY OF THE INVENTION

The present invention is a probing tip for a signal acquisition probe having a non-conductive substrate compatible with thin and thick film processing. The non-conductive substrate has opposing horizontal surfaces and side surfaces with two of the side surfaces converging to a point. One of the converging side surfaces has an angle of substantially forty degrees and the other converging side surface has an angle of substantially ten degrees. A contoured probing tip contact is formed at the converging point on the non-conductive substrate with the contoured probing tip contact having first and second intersecting arcuate surface and electrically conductive material deposited thereon.

The probing tip has a resistive element disposed on one of the opposing horizontal surfaces of the non-conductive substrate by thin or thick film processing with one end of the resistive element electrically coupled to the electrically conductive material on the contoured probing tip contact. The probing tip also has an amplifier, preferably in the form of a buffer amplifier, disposed on one of the opposing horizontal surfaces of the non-conductive substrate and electrically coupled to the other end of the resistive element. The resistive element is electrically coupled to the amplifier by a wire bond.

The electrically conductive material deposited on the contoured probing tip is formed of an adhesion layer with a layer of gold, platinum-gold alloy or the like deposited on the adhesion layer. The adhesion layer is preferably a titanium-tungsten alloy.

The non-conductive substrate with the contoured probing tip contact is preferably secured to a carrier formed from an insulating material, such as a liquid crystal polymer or the like. A second non-conductive substrate is secured to the carrier with the second non-conductive substrate having a grounded coplanar waveguide structure formed thereon. The second non-conductive substrate may be formed of a circuit board material, such as FR-4 circuit board material. Gold bond wires electrically couple the amplifier to the grounded coplanar waveguide structure.

The objects, advantages and other novel features of the present invention are apparent from the following detailed description when read in conjunction with the appended claims and drawing.

DETAILED DESCRIPTION OF THE INVENTION

Figure 1:
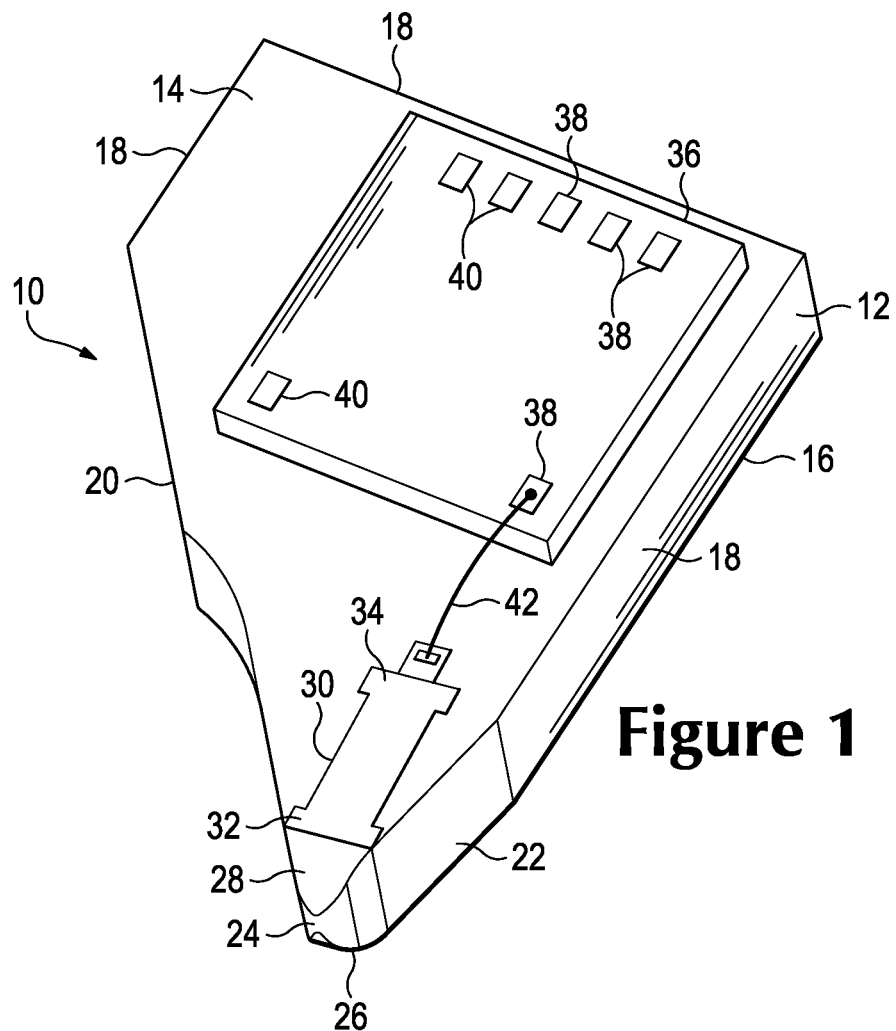
FIG. 1 is a perspective view of a probing tip for a signal acquisition probe according to the present invention.
Figure 2:
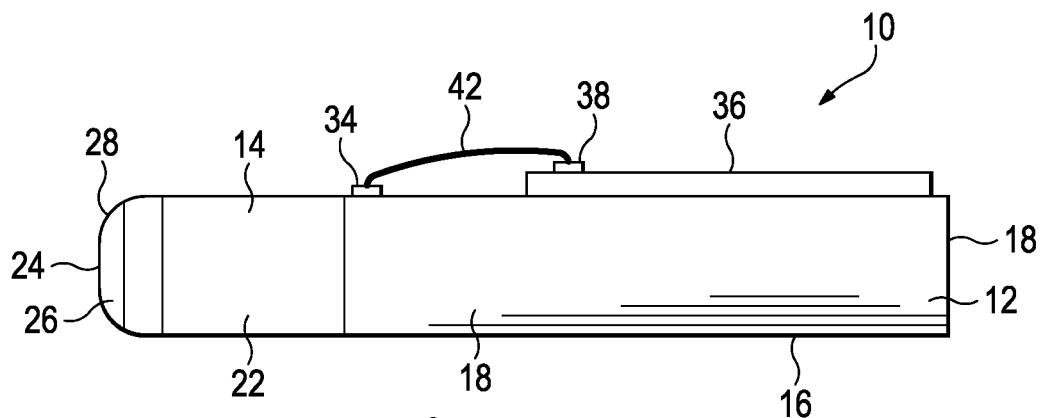
FIG. 2 is a side view of a probing tip for a signal acquisition probe according to the present invention.

Referring to FIGS. 1 and 2, there are shown respective perspective and side views of a probing tip 10 for a signal acquisition probe. The probing tip 10 has a substrate 12 formed from a rigid, non-conductive material, such as, fused quartz, fused silica, a ceramic material or the like, that is compatible with thin film processing requiring nominal processing temperatures of three hundred degrees Fahrenheit. The substrate has top and bottom surfaces 14, 16 and side surfaces 18. The substrate has a nominal width of 0.044 inches, a nominal length of 0.060 inches, and a nominal thickness of 0.010 inches. One of the side surfaces 18 has an angled section 20 having a nominal angle of forty degrees. The side surface 18 adjacent to the angled side surface section 20 also has an angled section 22 having a nominal angle of ten degrees. The angled sections 20 and 22 converge to a point where a probing tip contact 24 is formed. Alternately, the substrate 12 may also be compatible with thick film processing having nominal processing temperature of eight hundred and fifty degrees centigrade.

The probing tip contact 24 has a contoured surface on which is deposited an electrically conductive material. The contoured surface has a first arcuate surface 26 having a nominal radius of 0.0020 degrees and a second arcuate surface 28 having a nominal radius of 0.0040 degrees that intersects with the first arcuate surface forming a substantially rounded contact. An adhesion layer is deposited on the contoured probing tip contact 24 with an electrically conductive material deposited on the adhesion layer. In the preferred embodiment, the adhesion layer is a titanium-tungsten alloy on which is deposited a gold electrically conductive layer. Alternately, the electrically conductive layer may be platinum-gold alloy or other similar materials having similar properties. The intersecting arcuate surfaces 26 and 28 produce a substantially 3-dimensional spherical probing tip contact 24.

A thin or thick film resistive element 30 is deposited on the top surface 14 of the non-conductive substrate 12. Electrically conductive contacts 32 and 34 are deposited on either end of the resistive element 30 using thin or thick film processing. The electrical contacts 32 and 34 are formed with an adhesion layer of titanium-tungsten alloy on which is deposited a gold electrically conductive layer. Electrical contact 32 electrically connects the contoured probing tip contact 24 to the resistive element 30 and electrical contact 34 provides an electrical contact pad for wire bonding the resistive element 30 to an integrated circuit die 36. The integrated circuit die 36 is secured to the top surface 14 of the non-conductive substrate 12 using a non-conductive adhesive, such as an epoxy or the like. The integrated surface die 36 includes an amplifier circuit and bond pads 38 and 40. The amplifier circuit is preferably a buffer amplifier. A conductive wire 42 is bonded to one of the bond pads 38 and to the electrical contact 34 for electrically connecting the resistive element 30 to the input of the amplifier on the integrated circuit die 36. The other bond pads 38 are coupled to the output of the amplifier on the integrated circuit die 36.

Alternately, the integrated circuit die 36 may be secured to the top surface 14 of the non-conductive substrate 12 using flip-chip technology. Solder pads are formed on the top surface 14 with one of the solder pads electrically coupled to the electrical contact 34 of the resistive element 30 via a conductive trace deposited on the top surface 14. The integrated circuit die 36 had solder ball formed thereon that correspond to the solder pads on the top surface 14. The solder ball corresponding to the solder pad electrically coupled to the resistive element 30 is electrically coupled to the input of the amplifier circuit. The solder balls of the integrated circuit die 36 are positioned to the corresponding solder pads and heated to secure the integrated circuit die to the top surface 14 of the non-conductive substrate 12.

Figure 3:
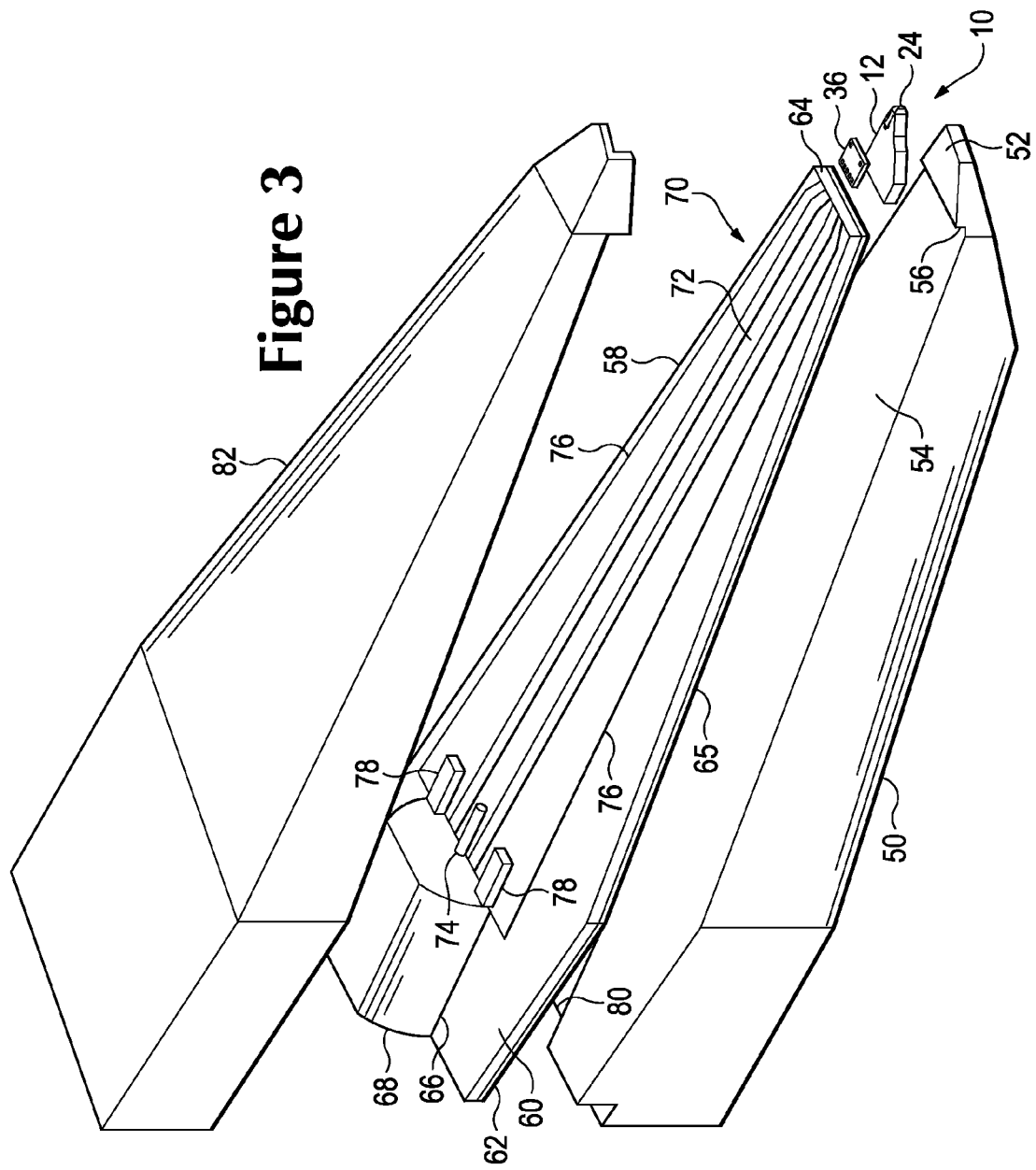
FIG. 3 is an exploded perspective view of a support and transmission structure for a signal acquisition probe according to the present invention.

Referring to FIG. 3, there is shown an exploded perspective view of a support structure for the probing tip 10 for a signal acquisition probe. The support structure has a substantially triangular shaped carrier 50 having a raised pedestal region 52 and adjacent recessed region 54. The carrier 50 is constructed of a low dielectric, high strength non-conductive material, such as a liquid crystal polymer or the like, that may be formed using an injection molding process. The non-conductive substrate 12 of the probing tip 10 is secured to the pedestal region 52 using a non-conductive adhesive, such as an epoxy or the like. The contoured probing tip contact 24 extends past the front surface of the pedestal 52 permitting the contoured probing tip contact 24 to engage test points on a device under test. The opposite end of the pedestal 52 has a vertical wall 56 transitioning to the recessed region 54. A substrate 58 formed of a non-conductive material, such as FR-4 circuit board material, ceramic material or the like, has a periphery similar in shape to the recessed region 54 as is secured thereon. The substrate 58 has top and bottom surfaces 60, 62 and a front surface 64 that abuts the vertical wall 56 of the pedestal 52. A conductive layer or substrate 65 is disposed on the bottom surface 62 of the substrate 58 as a ground layer. The opposite end of the substrate 58 has a notch 66 formed therein that receives a coaxial signal connector 68. The substrate 58 has a thickness that elevates the top surface 60 so as to be co-planar with the top surface 14 of the non-conductive substrate 12 of the probing tip 10. A transmission structure 70 is disposed on the top surface 60 of the substrate 58. The transmission structure 70 is preferably a grounded coplanar transmission structure having a conductive trace 72 that is electrically connected to a center signal conductor 74 of the coaxial signal connector 68. Ground planes 76 are disposed adjacent to and on either side of the conductive trace 72. The ground planes 76 are electrically connected to tabs 78 extending from the coaxial signal connector 68. A recess 80 is formed in the carrier 50 at the opposite end from the pedestal 52 for receiving the lower portion of the coaxial signal connector 68. A top cover 82 is secured to the carrier 50 using well known affixing means, such as sonic welding, adhesives, such as epoxy, or the like.

Figure 4:
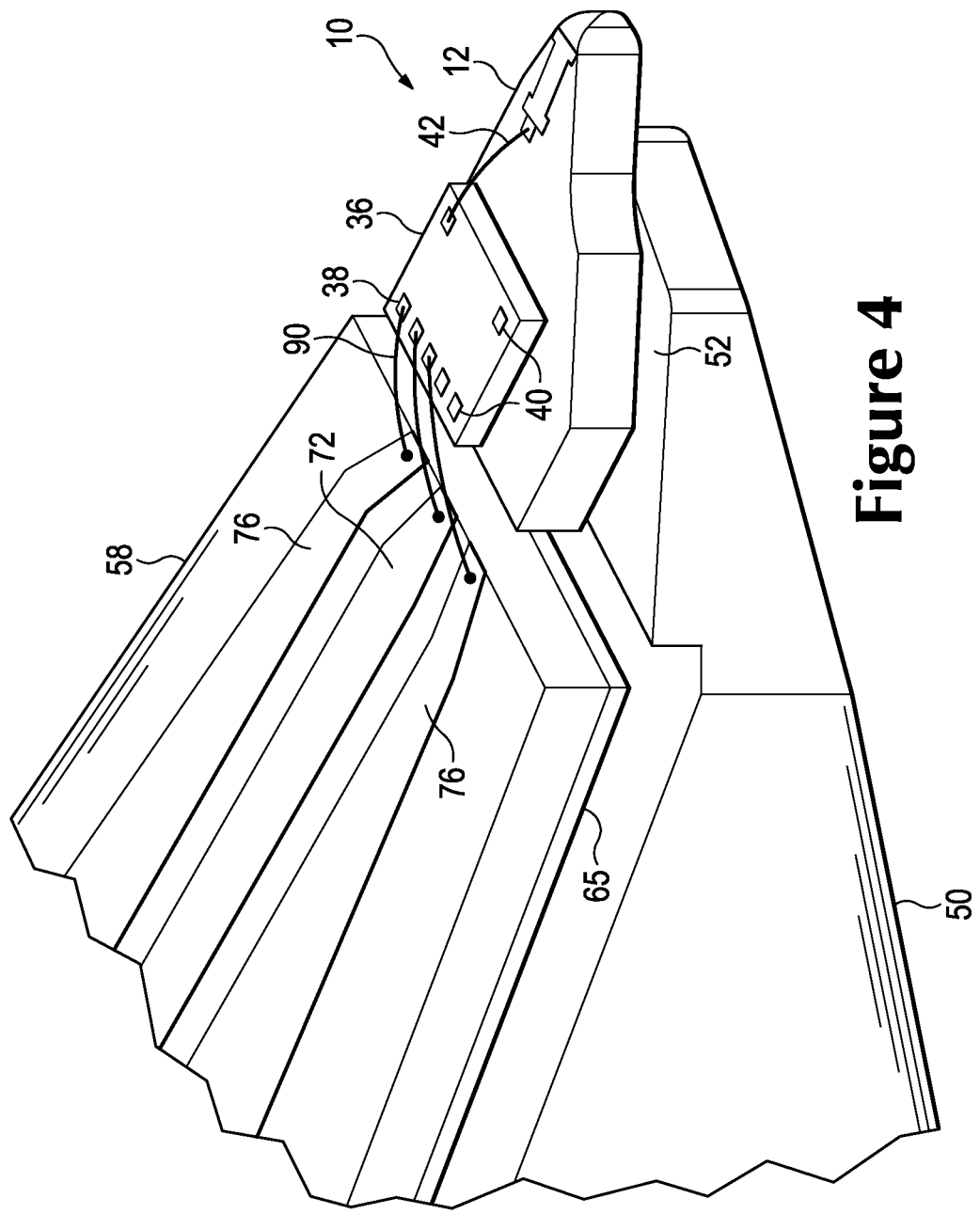
FIG. 4 is a detailed view of the front portion of the probing tip for a signal acquisition probe according to the present invention.

FIG. 4 is a detailed view of the front portion of the probing tip 10. Conductive wires 90 extend from the bond pads 38 of the integrated circuit die 36 to the respective conductive trace 72 and ground planes 76 of the transmission structure 70. The conductive wires 90 are wire bonded to bond pads 38 and the conductive trace 72 and ground planes 76. Conductive wires (not shown for clarity in the drawing figure) extend from the bond pads 40 of the integrated circuit die 36 to conductive traces (not shown for clarity in the drawing figure) on the substrate 58 for providing power and communication signals to the integrated circuit die 36. In the flip-chip alternate embodiment, the bond pads 38 and 40 are formed on the exposed surface of the integrated circuit die 36 and are electrically coupled to the conductive trace 72, ground planes 76 and conductive traces providing power and communication signals via conductive wires.

It will be obvious to those having skill in the art that many changes may be made to the details of the above-described embodiments of this invention without departing from the underlying principles thereof. The scope of the present invention should, therefore, be determined only by the following claims.

What is claimed is:

1. A probing tip for a signal acquisition probe comprising:
   a non-conductive substrate compatible with thin and thick film processing having opposing horizontal surfaces and side surfaces with two of the side surfaces converging to a point;
   a contoured probing tip contact formed at the converging point on the non-conductive substrate with the probing tip contact having first and second intersecting arcuate surface; and
   electrically conductive material deposited on the countered probing tip contact.

2. The probing tip for a signal acquisition probe as recited in claim 1 further comprising a resistive element disposed on one of the opposing horizontal surfaces of the non-conductive substrate by at least one of thin and thick film processing and having one end electrically coupled to the electrically conductive material on the contoured probing tip contact.

3. The probing tip for a signal acquisition probe as recited in claim 2 further comprising an amplifier disposed on one of the opposing horizontal surfaces of the non-conductive substrate and electrically coupled to the other end of the resistive element.

4. The probing tip for a signal acquisition probe as recited in claim 3 wherein the amplifier is a buffer amplifier.

5. The probing tip for a signal acquisition probe as recited in claim 3 further comprising a wire bond electrically coupling the other end of the resistive element to the amplifier.

6. The probing tip for a signal acquisition probe as recited in claim 1 wherein the electrically conductive material comprises an adhesion layer deposited on the contoured probing tip contact and a layer of gold deposited on the adhesion layer.

7. The probing tip for a signal acquisition probe as recited in claim 6 wherein the adhesion layer is formed of titanium-tungsten.

8. The probing tip for a signal acquisition probe as recited in claim 1 wherein the electrically conductive material comprises an adhesion layer deposited on the contoured probing tip contact and a layer of platinum-gold deposited on the adhesion layer.

9. The probing tip for a signal acquisition probe as recited in claim 8 wherein the adhesion layer is formed of titanium-tungsten.

10. The probing tip for a signal acquisition probe as recited in claim 1 wherein one of the converging side surfaces of the non-conductive substrate has an angle of substantially forty degrees.

11. The probing tip for a signal acquisition probe as recited in claim 10 wherein the other of the converging side surfaces of the non-conductive substrate has an angle of substantially ten degrees.

12. The probing tip for a signal acquisition probe as recited in claim 1 further comprising a carrier on which the non-conductive substrate is secured.

13. The probing tip for a signal acquisition probe as recited in claim 12 further comprising a second non-conductive substrate secured to the carrier.

14. The probing tip for a signal acquisition probe as recited in claim 13 further comprising a grounded coplanar waveguide structure formed on the second non-conductive substrate.

15. The probing tip for a signal acquisition probe as recited in claim 12 wherein the second non-conductive substrate is formed of a circuit board material.

16. The probing tip for a signal acquisition probe as recited in claim 14 further comprising gold bond wires electrically coupling the amplifier to the grounded coplanar waveguide structure.

* * * * *